United States Patent
Hong

(10) Patent No.: US 9,401,186 B2
(45) Date of Patent: Jul. 26, 2016

(54) SEMICONDUCTOR MEMORY APPARATUS AND DATA TRANSMISSION

(71) Applicant: SK hynix Inc., Icheon-si Gyeonggi-do (KR)

(72) Inventor: Yun Gi Hong, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/687,208

(22) Filed: Apr. 15, 2015

(65) Prior Publication Data

US 2016/0180895 A1    Jun. 23, 2016

(30) Foreign Application Priority Data

Dec. 22, 2014    (KR) .................. 10-2014-0186075

(51) Int. Cl.
| | |
|---|---|
| *G11C 16/26* | (2006.01) |
| *G11C 7/10* | (2006.01) |
| *G11C 7/06* | (2006.01) |
| *G11C 7/12* | (2006.01) |
| *G11C 7/22* | (2006.01) |

(52) U.S. Cl.
CPC *G11C 7/106* (2013.01); *G11C 7/06* (2013.01); *G11C 7/12* (2013.01); *G11C 7/22* (2013.01)

(58) Field of Classification Search
CPC ............................ G11C 16/26; G11C 11/4091

USPC .............................................. 365/189.05, 205
See application file for complete search history.

(56) References Cited

U.S. PATENT DOCUMENTS

| | | | | |
|---|---|---|---|---|
| 7,492,653 | B2 * | 2/2009 | Ku ......................... | G11C 29/02 365/189.05 |
| 7,929,355 | B2 * | 4/2011 | Jang ..................... | G11C 7/1012 365/189.02 |
| 7,983,288 | B2 * | 7/2011 | Lee ......................... | G11C 7/10 365/189.02 |
| 8,050,374 | B2 * | 11/2011 | Kim ....................... | G11C 16/32 375/354 |
| 8,295,100 | B2 * | 10/2012 | Lee ....................... | G11C 7/1039 365/189.05 |
| 8,397,133 | B2 * | 3/2013 | Clark .................... | G06F 9/3867 714/766 |
| 8,482,995 | B2 * | 7/2013 | Shin ..................... | G11C 7/1051 365/191 |
| 9,099,170 | B2 * | 8/2015 | Lim ....................... | G11C 7/106 |

FOREIGN PATENT DOCUMENTS

| | | | |
|---|---|---|---|
| KR | 101053537 B1 | 8/2011 | |
| KR | 101090410 B1 | 12/2011 | |

* cited by examiner

*Primary Examiner* — Michael Tran
(74) *Attorney, Agent, or Firm* — William Park & Associates Ltd.

(57) ABSTRACT

A semiconductor memory apparatus may include a data pad and a shared transmission line. The shared transmission line may be configured to transmit data received through the data pad to a data alignment unit in a write operation, and transmit data outputted from a pipe latch unit to the data pad in a read operation.

15 Claims, 5 Drawing Sheets

410

SEMICONDUCTOR MEMORY APPARATUS AND DATA TRANSMISSION

CROSS-REFERENCES TO RELATED APPLICATION

The present application claims priority under 35 U.S.C. §119(a) to Korean application number 10-2014-0186075, filed on Dec. 22, 2014, in the Korean Intellectual Property Office, which is incorporated herein by reference in its entirety as set forth in full.

BACKGROUND

1. Technical Field

Various embodiments generally relate to a semiconductor apparatus, and more particularly, to a semiconductor memory apparatus and a data transmission method.

2. Related Art

In general, a semiconductor memory apparatus performs an operation for storing and outputting a plurality of data pieces. In this case, the semiconductor memory apparatus may receive data to be written in the semiconductor memory apparatus through a data pad, and output data stored in the semiconductor memory apparatus. With regards to a write operation, the semiconductor memory apparatus may transmit data received through the data pad to a memory band area. With regards to a read operation, the semiconductor memory apparatus may output data transmitted from the memory bank area through the data pad.

As an operation speed of the semiconductor memory apparatus is improved and a data bandwidth increased, the number of data transmitted increases as well as the number of lines from the data pad to the memory bank area. Furthermore, the number of control signals for processing data pieces also increases. Accordingly, the semiconductor memory apparatus is configured to transmit signals through a metal line, but as the degree of integration increases, a limitation may occur in the number of metal lines which may be arranged.

SUMMARY

According to an embodiment, there may be provided a semiconductor memory apparatus. The semiconductor memory apparatus may include a data pad, and a shared transmission line configured to transmit data received through the data pad to a data alignment unit in a write operation and to transmit data outputted from a pipe latch unit to the data pad in a read operation.

According to an embodiment, there may be provided a semiconductor memory apparatus. The semiconductor memory apparatus may include a shared transmission line configured to be coupled to a data pad. The semiconductor memory apparatus may include a first path selection unit configured to couple one of a data alignment unit and a pipe latch unit to the shared transmission line in response to a write control signal and a read control signal.

According to an embodiment, there may be provided a semiconductor memory apparatus. The semiconductor memory apparatus may include a data pad. The semiconductor memory apparatus may include a shared transmission line configured to transmit data received through the data pad to a first data transmission line in a write operation, and to transmit data received from the first data transmission line to the data pad in a read operation.

DETAILED DESCRIPTION

Various examples of the embodiments may be directed to a semiconductor memory apparatus capable of reducing the number of transmission lines between a data pad and a data input/output unit is described herein.

Figure 1:
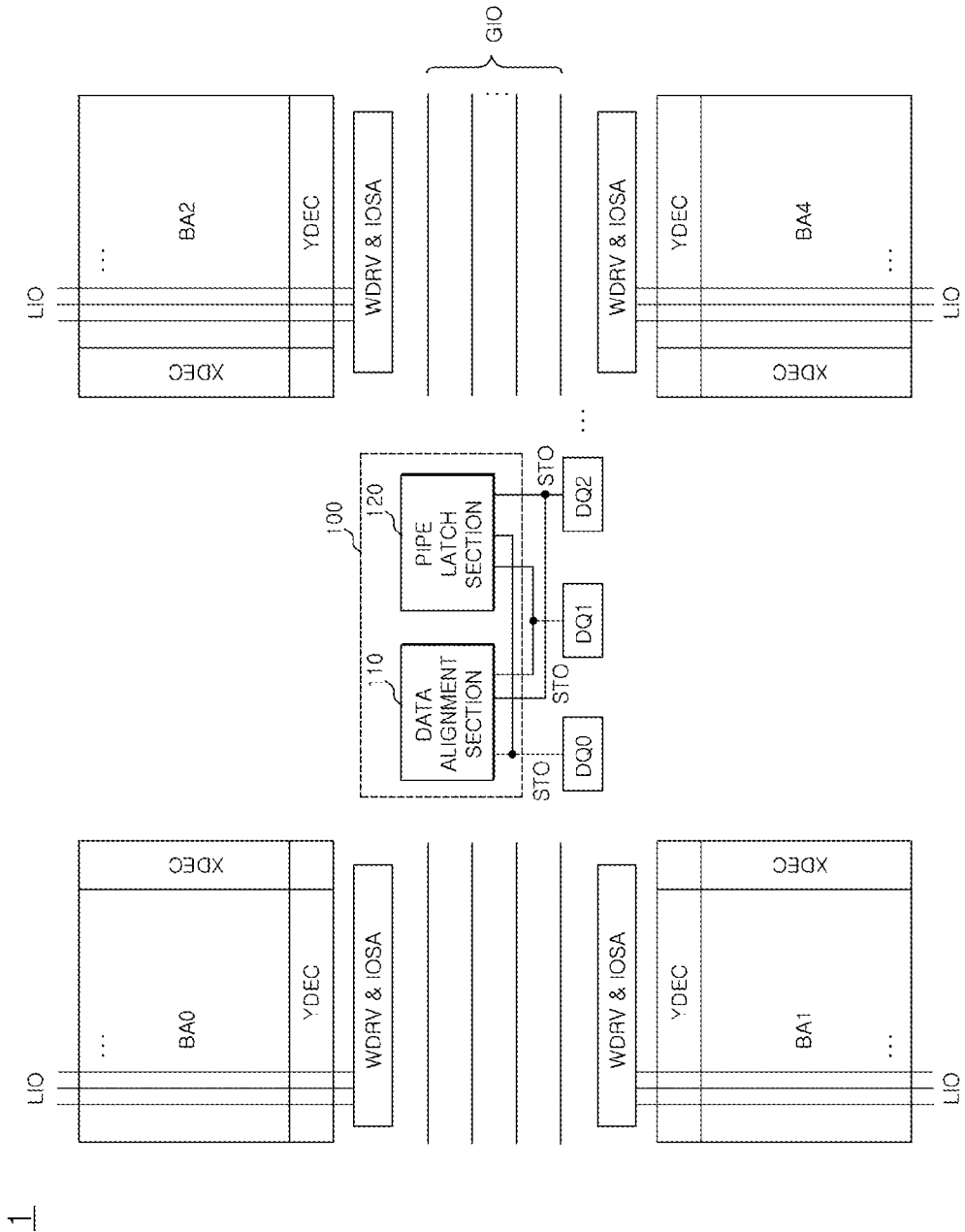
FIG. 1 is a diagram illustrating a representation of an example of a configuration of a semiconductor memory apparatus according to an embodiment.

Referring to FIG. 1, a semiconductor memory apparatus 1 according to an embodiment may include a plurality of memory banks. FIG. 1 illustrates first to fourth memory banks BA0 to BA3; however, the semiconductor memory apparatus 1 is not limited in this manner and may include more than four memory banks or less than 4 memory banks. The semiconductor memory apparatus 1 may include a larger number of memory banks. The memory banks BA0 to BA3 may be arranged in memory bank areas and a space between the memory bank areas may be a peripheral area. In the peripheral area, elements including data pads DQ0 to DQ2, a data input/output unit 100, a first data transmission line GIO and the like may be arranged. The data pads DQ0 to DQ2 may be coupled to a bus coupled to an external apparatus, and the semiconductor memory apparatus 1 may receive data transmitted from an exterior of the semiconductor memory apparatus 1 through the data pads DQ0 to DQ2, or output data stored in the memory banks BA0 to BA3 to the external apparatus, outside the semiconductor memory apparatus 1, through the data pads DQ0 to DQ2.

The data input/output unit 100 may convert data inputted through the data pads DQ0 to DQ2 into data available in the semiconductor memory apparatus 1 and vice versa. The data input/output unit 100 may include a data alignment section 110 and a pipe latch section 120. For example, the semiconductor memory apparatus 1 may perform serial data communication with the external apparatus, and data received or outputted through the data pads DQ0 to DQ2 may be serial type data. The data alignment section 110 may convert the serial type data inputted through the data pads DQ0 to DQ2 into parallel type data, and the pipe latch section 120 may convert parallel type data transmitted through the first data transmission line GIO into serial type data. The data alignment section 110 and the pipe latch section 120 may be commonly coupled to the data pads DQ0 to DQ2 through a shared transmission line STO. Accordingly, data transmitted through the shared transmission line STO may be serial type data.

The first data transmission line GIO may couple the data pads DQ0 to DQ2 to the memory bank areas. The first data transmission line GIO may be arranged over all the memory bank areas across the peripheral area. The first data transmission line GIO may couple the data alignment section 110 to the memory bank area and couple the memory bank area to the pipe latch section 120.

In the memory bank areas, the first to fourth memory banks BA0 to BA3 may be arranged, wherein the first to fourth memory banks BA0 to BA3 may include a plurality of bit lines, a plurality of word lines, and a plurality of memory cells accessible when the plurality of bit lines and word lines are selected. Each of the first to fourth memory banks BA0 to BA3 may include a column decoding circuit YDEC for selecting a desired bit line from the plurality of bit lines. Each of the first to fourth memory banks BA0 to BA3 may include a row decoding circuit XDEC for selecting a desired word line from the plurality of word lines.

On the first to fourth memory banks BA0 to BA3, a second data transmission line LIO may be arranged. The second data transmission line LIO may be coupled to the first data transmission line GIO through a write driver WDRV and an input/output sense amplifier IOSA. The write driver WDRV may amplify data transmitted through the first data transmission line GIO, and output the amplified data to the second data transmission line LIO in a write operation. The input/output sense amplifier IOSA may amplify data transmitted through the second data transmission line LIO, and output the amplified data to the first data transmission line GIO in a read operation. The second data transmission line LIO may be coupled to bit lines selected by the column decoding circuit YDEC and the row decoding circuit XDEC. In the write operation, data inputted through the data pads DQ0 to DQ2 may be transferred to a memory cell through the second data transmission line LIO and may be stored. In the read operation, the data stored in the memory cell may be outputted through the second data transmission line LIO.

Figure 2:
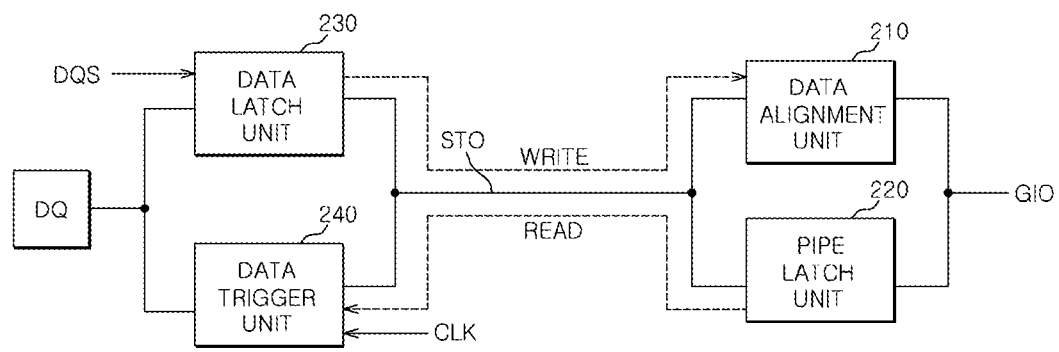
FIG. 2 is a diagram illustrating a representation of an example of elements arranged in a peripheral area according to an embodiment.

FIG. 2 is a diagram illustrating a representation of an example of elements arranged in the peripheral area according to an embodiment. Referring to FIG. 2, the semiconductor memory apparatus may include a data pad DQ, a shared transmission line STO, and a data alignment unit 210. The semiconductor memory apparatus may include a pipe latch unit 220. The shared transmission line STO may couple the data pad DQ to the data alignment unit 210 and the pipe latch unit 220. The shared transmission line STO may transmit data received through the data pad DQ to the data alignment unit 210 in a write operation. The shared transmission line STO may transmit data outputted from the pipe latch unit 220 to the data pad DQ in a read operation. The semiconductor memory apparatus may perform the write operation and the read operation at a predetermined time interval. Accordingly, even though the data alignment unit 210 and the pipe latch unit 220 are coupled to the data pad DQ through the shared transmission line STO, a data collision on the shared transmission line STO may not occur. For example, data transmitted to the data alignment unit 210 through the shared transmission line STO in the write operation does not collide with data transmitted to the data pad DQ through the shared transmission line STO in the read operation.

The data alignment unit 210 and the pipe latch unit 220 may be coupled to the first data transmission line GIO. In the write operation, the data alignment unit 210 may convert serial type data transmitted through the shared transmission line STO into parallel type data, and may allow the converted data to be transmitted to the memory bank area through the first data transmission line GIO. In the read operation, the pipe latch unit 220 may convert the parallel type data transmitted through the first data transmission line GIO into serial type data, and may allow the converted data to be transmitted to the data pad DQ through the shared transmission line STO.

The semiconductor memory apparatus may further include a data latch unit 230 and a data trigger unit 240. The data latch unit 230 may latch data received through the data pad DQ, and transmit the latched data to the data alignment unit 210 through the shared transmission line STO. The data latch unit 230 may latch the data received through the data pad DQ in synchronization with a data strobe signal DQS. The data strobe signal DQS may be a write data strobe signal provided from an external apparatus together with the data.

The data trigger unit 240 may receive data outputted from the pipe latch unit 220 through the shared transmission line STO. The data trigger unit 240 may output the data outputted from the pipe latch unit 220 to the data pad DQ in synchronization with a clock signal CLK. The clock signal CLK may have a phase synchronized with a system clock signal used in data communication between the semiconductor memory apparatus and the external apparatus.

Referring to FIG. 2, in the write operation WRITE, data inputted to the data pad DQ may be transmitted to the first data transmission line GIO by sequentially passing through the data latch unit 230, the shared transmission line STO, and the data alignment unit 210. In the read operation READ, data transmitted through the first data transmission line GIO may be transmitted to the data pad DQ by sequentially passing through the pipe latch unit 220, the shared transmission line STO, and the data trigger unit 240.

As described above with relation to FIG. 1, since the semiconductor memory apparatus may include a plurality of data pads DQ, the number of transmission lines from the plurality of data pads DQ to the data alignment unit 210 and the pipe latch unit 220 may also increase. The semiconductor memory apparatus according to an embodiment commonly couples the data pads DQ to the data alignment unit 210 and the pipe latch unit 220 by using the shared transmission line STO, so that it may be possible to efficiently reduce the number of metal lines arranged in the memory bank area.

Figure 3:
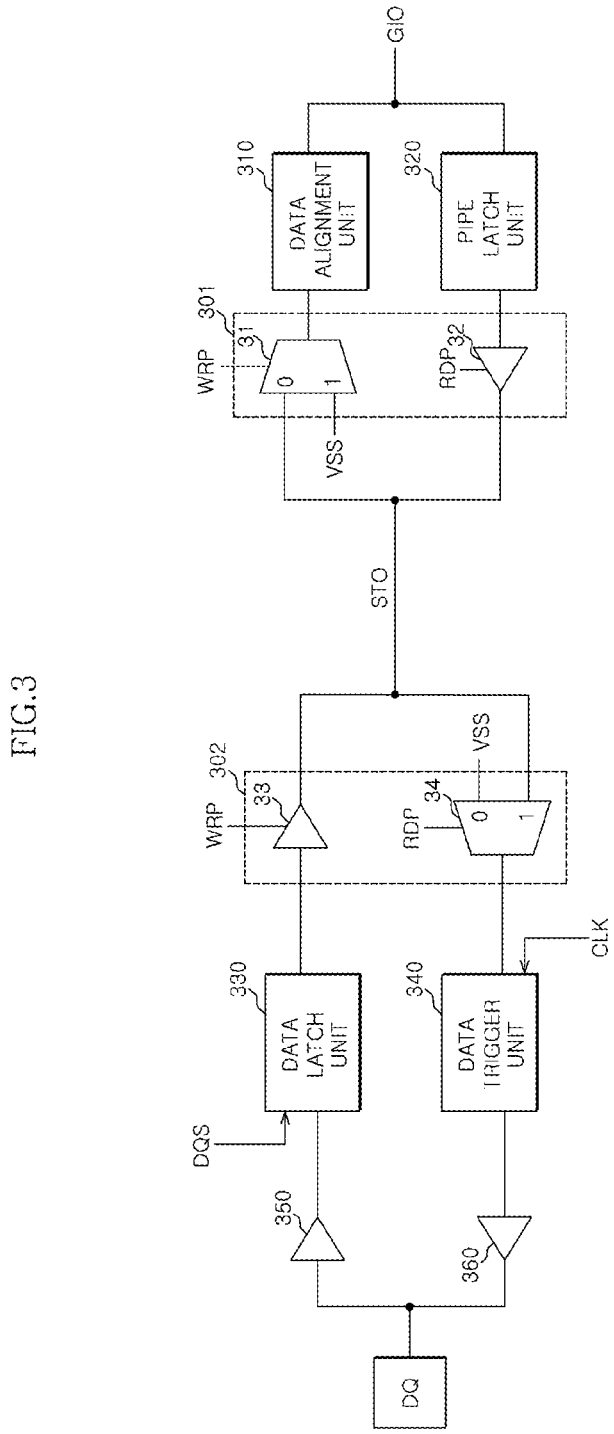
FIG. 3 is a diagram illustrating a representation of an example of elements arranged in a peripheral area according to an embodiment.

FIG. 3 is a diagram illustrating a representation of an example of elements arranged in the peripheral area according to an embodiment. Referring to FIG. 3, the semiconductor memory apparatus may include the shared transmission line STO and a first path selection unit 301. The shared transmission line STO may be coupled to a data pad DQ. The first path selection unit 301 may couple one of a data alignment unit 310 and a pipe latch unit 320 to the shared transmission line STO in response to a write control signal WRP and a read control signal RDP. The first path selection unit 301 may couple the shared transmission line STO to the data alignment unit 310 when the write control signal WRP is enabled. The first path selection unit 301 may couple the shared transmission line STO to the pipe latch unit 320 when the read control signal RDP is enabled.

The semiconductor memory apparatus may further include a data latch unit 330, a data trigger unit 340, and a second path selection unit 302. The data latch unit 330 may latch data received through the data pad DQ, and transmit the latched data to the shared transmission line STO. The data latch unit 330 may latch the data received through the data pad DQ in synchronization with the data strobe signal DQS. The data trigger unit 340 may output data transmitted through the shared transmission line STO to the data pad DQ. The data trigger unit 340 may output the data transmitted through the shared transmission line STO to the data pad DQ in synchronization with the clock signal CLK.

The second path selection unit 302 may couple one of the data latch unit 330 and the data trigger unit 340 to the shared transmission line STO in response to the write control signal WRP and the read control signal RDP. The second path selection unit 302 may couple the data latch unit 330 to the shared transmission line STO in a write operation. The second path selection unit 302 may couple the data trigger unit 340 to the shared transmission line STO in a read operation.

Referring to FIG. 3, the first path selection unit 301 may further include a write reception section 31 and a read transmission section 32. The write reception section 31 may couple one of the shared transmission line STO and a ground voltage VSS to the data alignment unit 310 in response to the write control signal WRP. The write reception section 31 may include a multiplexer that outputs one of data transmitted through the shared transmission line STO and the ground voltage VSS to the data alignment unit 310 under the control of the write control signal WRP. The read transmission section 32 may couple the pipe latch unit 320 to the shared transmission line STO in response to the read control signal RDP. The read transmission section 32 may include a three-state driver that drives data outputted from the pipe latch unit 320 and outputs the driven data to the shared transmission line STO under the control of the read control signal RDP.

The second path selection unit 302 may include a write transmission section 33 and a read reception section 34. The write transmission section 33 may couple the data latch unit 330 to the shared transmission line STO in response to the write control signal WRP. The write transmission section 33 may include a three-state driver that drives data outputted from the data latch unit 330 and outputs the driven data to the shared transmission line STO under the control of the write control signal WRP. The read reception section 34 may couple one of the shared transmission line STO and the ground voltage VSS to the data trigger unit 340 in response to the read control signal RDP. The read reception section 34 may a multiplexer that outputs data transmitted through the shared transmission line STO and the ground voltage VSS to the data trigger unit 340 under the control of the read control signal RDP.

The semiconductor memory apparatus may further include an input buffer 350 and an output buffer 360. The input buffer 350 may buffer data received through the data pad DQ, and output the buffered data to the data latch unit 330. The output buffer 360 may buffer data outputted from the data trigger unit 340, and output the buffered data to the data pad DQ.

The semiconductor memory apparatus may included the shared transmission line STO and the first and second path selection units 301 and 302, thereby forming a write transmission path and a read transmission path as follows. In the write operation, the first and second path selection units 301 and 302 respectively couple the data alignment unit 310 and the data latch unit 330 to the shared transmission line STO, and allows data transmitted from an external apparatus to be transmitted to the first data transmission line GIO by sequentially passing through the data pad DQ, the input buffer 350, the data latch unit 330, the shared transmission line STO, and the data alignment unit 310. In the read operation, the first and second path selection units 301 and 302 respectively couple the pipe latch unit 320 and the data trigger unit 340 to the shared transmission line STO, and allows data outputted from the memory bank area and transmitted through the first data transmission line GIO to be transmitted to the external apparatus by sequentially passing through the pipe latch unit 320, the shared transmission line STO, the data trigger unit 340, the output buffer 360, and the data pad DQ.

Figure 4:
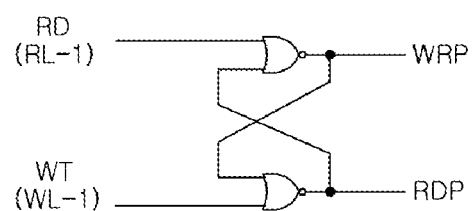
FIG. 4 is a diagram illustrating a representation of an example of a configuration of a control signal generation unit configured to generate a write control signal and a read control signal.

FIG. 4 is a diagram illustrating a representation of an example of the configuration of a control signal generation unit 410 configured for generating the write control signal WRP and the read control signal RDP. Referring to FIG. 4, the control signal generation unit 410 may include an SR latch. The control signal generation unit 410 may enable the write control signal WRP when a write signal WT is enabled, and enable the read control signal RDP when a read signal RD is enabled. Accordingly, an enable period of the write control signal WRP and an enable period of the read control signal RDP may not overlap each other. The write signal WT may be generated from a write command received in the semiconductor memory apparatus from the external apparatus. The read signal RD may be generated from a read command received in the semiconductor memory apparatus from the external apparatus.

The semiconductor memory apparatus may operate by defining write latency WL and read latency RL. The write latency WL and the read latency RL may include a delay value. For example, the write latency WL may indicate a delay time until the semiconductor memory apparatus actually performs the write operation after the write command is inputted. For example, the read latency RL may indicate a delay time until the semiconductor memory apparatus actually performs the read operation after the read command is inputted. The write latency WL and the read latency RL may set as values different from each other. In an embodiment, it may be preferable that the write signal WT is enabled earlier than a time corresponding to the write latency WL after the semiconductor memory apparatus receives the write command (WL−1). In an embodiment, it may be preferable that the read signal RD is enabled earlier than a time corresponding to the read latency RL after the semiconductor memory apparatus receives the read command (RL−1). For example, the write signal WT and the read signal RD may be respectively enabled earlier than the times corresponding to the write latency WL and the read latency RL by one cycle of a clock signal. The control signal generation unit 410 enables the write signal WT and the read signal RD earlier than the times corresponding to the write latency and the read latency, and generates the write control signal WRP and the read control signal RDP, so that it may be possible to ensure a time margin to substantially prevent data for the write operation and data for the read operation from colliding each other in the shared transmission line STO.

Figure 5:
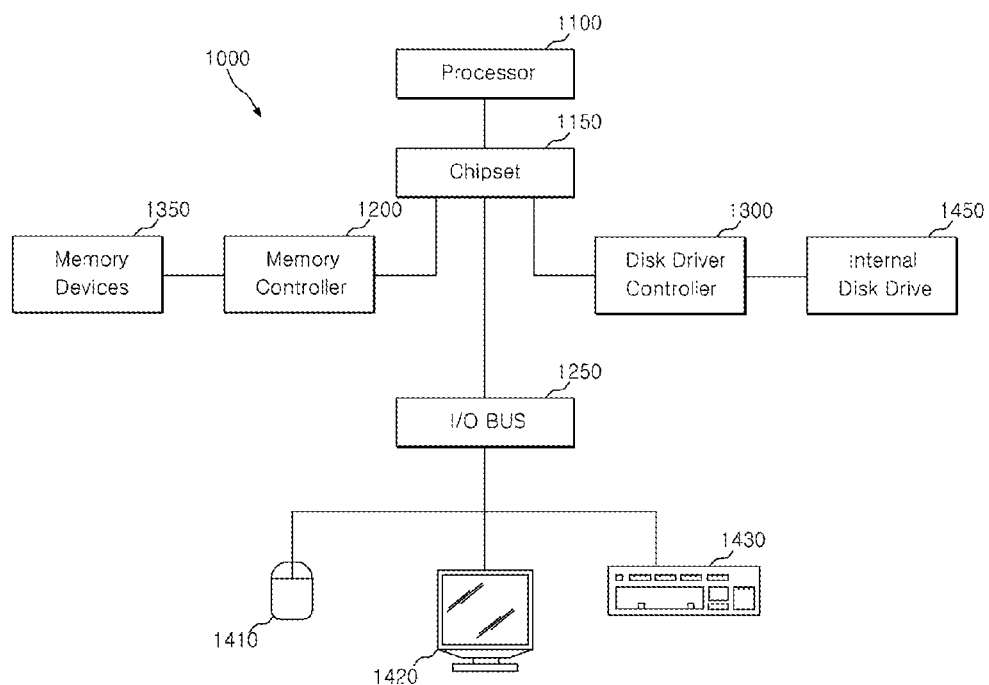
FIG. 5 illustrates a block diagram of an example of a representation of a system employing a semiconductor memory apparatus in accordance with the various embodiments discussed above with relation to FIGS. 1-4.

The semiconductor memory apparatus discussed above (see FIGS. 1-4) are particular useful in the design of memory devices, processors, and computer systems. For example, referring to FIG. 5, a block diagram of a system employing the semiconductor memory apparatus in accordance with the various embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor memory apparatus as discussed above with reference to FIGS. 1-4. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor memory apparatus as discussed above with relation to FIGS. 1-4, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 5 is merely one example of a system employing the semiconductor memory apparatus as discussed above with relation to FIGS. 1-4. In alternate embodiments, such as cellular phones or digital cameras, the components may differ from the embodiments illustrated in FIG. 5.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
    a data pad;
    a shared transmission line configured to transmit data received through the data pad to a data alignment unit in a write operation, and to transmit data outputted from a pipe latch unit to the data pad in a read operation; and
    a path selection unit configured to couple the shared transmission line to the data alignment unit in the write operation, and to couple the shared transmission line to the pipe latch unit in the read operation.

2. The semiconductor memory apparatus according to claim 1, wherein the data alignment unit and the pipe latch unit are coupled to a memory bank area through a first data transmission line.

3. The semiconductor memory apparatus according to claim 2, further comprising:
    a write driver configured to amplify data transmitted through the first data transmission line and output amplified data to a second data transmission line; and
    an input/output sense amplifier configured to amplify data transmitted through the second data transmission line and output amplified data to the first data transmission line.

4. The semiconductor memory apparatus according to claim 1, wherein data transmitted through the shared transmission line includes serial type data.

5. The semiconductor memory apparatus according to claim 1, wherein the data alignment unit converts serial type data transmitted through the shared transmission line into parallel type data, and transmits the converted data to a memory bank area through the first data transmission line.

6. The semiconductor memory apparatus according to claim 1, wherein the pipe latch unit converts parallel type data transmitted from a memory bank area through the first data transmission line into serial type data, and transmits the converted data to the shared transmission line.

7. A semiconductor memory apparatus comprising:
    a shared transmission line configured to be coupled to a data pad; and
    a first path selection unit configured to couple one of a data alignment unit and a pipe latch unit to the shared transmission line in response to a write control signal and a read control signal.

8. The semiconductor memory apparatus according to claim 7, further comprising:
    a data latch unit configured to latch data received through the data pad and output latched data to the shared transmission line;
    a data trigger unit configured to output data transmitted through the shared transmission line to the data pad; and
    a second path selection unit configured to couple one of the data latch unit and the data trigger unit to the shared transmission line in response to the write control signal and the read control signal.

9. The semiconductor memory apparatus according to claim 7, further comprising:
    a control signal generation unit configured to generate the write control signal and the read control signal based on a write signal and a read signal,
    wherein enable periods of the write control signal and the read control signal are at different periods.

10. The semiconductor memory apparatus according to claim 9, wherein the write signal is enabled earlier than a time corresponding to write latency after the semiconductor memory apparatus receives a write command, and the read signal is enabled earlier than a time corresponding to read latency after the semiconductor memory apparatus receives a read command.

11. The semiconductor memory apparatus according to claim 7, wherein the data alignment unit and the pipe latch unit are coupled to a memory bank area through a first data transmission line.

12. The semiconductor memory apparatus according to claim 11, further comprising:
    a write driver configured to amplify data transmitted through the first data transmission line and output amplified data to a second data transmission line; and an input/output sense amplifier configured to amplify data transmitted through the second data transmission line and output amplified data to the first data transmission line.

13. The semiconductor memory apparatus according to claim 7, wherein data transmitted through the shared transmission line includes serial type data.

14. The semiconductor memory apparatus according to claim 7, wherein the data alignment unit converts serial type data transmitted through the shared transmission line into parallel type data, and transmits the converted data to a memory bank area through the first data transmission line.

15. The semiconductor memory apparatus according to claim 7, wherein the pipe latch unit converts parallel type data transmitted from a memory bank area through the first data transmission line into serial type data, and transmits the converted data to the shared transmission line.

* * * * *